United States Patent
Song (10) Patent No.: US 8,030,989 B2
(45) Date of Patent: Oct. 4, 2011

(54) INTERNAL VOLTAGE GENERATION CIRCUIT

(75) Inventor: Ho Uk Song, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 89 days.

(21) Appl. No.: 12/583,961

(22) Filed: Aug. 28, 2009

(65) Prior Publication Data

US 2010/0244939 A1    Sep. 30, 2010

(30) Foreign Application Priority Data

Mar. 26, 2009    (KR) .................. 10-2009-0026045

(51) Int. Cl.
*G05F 1/10*    (2006.01)
*G05F 3/02*    (2006.01)

(52) U.S. Cl. ........................................... 327/541

(58) Field of Classification Search .................. 327/538, 327/540, 541, 543
See application file for complete search history.

(56) References Cited

U.S. PATENT DOCUMENTS

| | | | |
|---|---|---|---|
| 5,512,814 A * | 4/1996 | Allman | 323/267 |
| 6,313,694 B1 * | 11/2001 | Sohn | 327/541 |
| 7,463,081 B2 * | 12/2008 | Jin | 327/540 |
| 7,750,611 B2 * | 7/2010 | Lee | 323/274 |
| 2004/0217804 A1 * | 11/2004 | Moon et al. | 327/540 |
| 2005/0073356 A1 * | 4/2005 | Won | 327/541 |
| 2006/0082411 A1 * | 4/2006 | Park et al. | 327/540 |
| 2007/0201284 A1 | 8/2007 | Kang | |
| 2008/0143312 A1 * | 6/2008 | Lee | 323/284 |
| 2008/0159047 A1 | 7/2008 | Chu | |
| 2009/0140793 A1 | 6/2009 | Byeon | |

FOREIGN PATENT DOCUMENTS

KR    10-2007-0109221    11/2007

* cited by examiner

*Primary Examiner* — Quan Tra
(74) *Attorney, Agent, or Firm* — John P. White; Cooper & Dunham LLP (57) ABSTRACT

An internal voltage generation circuit includes an initial driver configured to sense an internal voltage for a predetermined period of time from the beginning of an active mode and to drive a driving signal, which is used for driving the internal voltage to a level of an external voltage, to a first level, an initial driving terminator configured to drive the driving signal to a second level if the internal voltage is higher than a target level, and a comparison driver configured to drive the driving signal so as to maintain the internal voltage at a target level.

22 Claims, 7 Drawing Sheets

INTERNAL VOLTAGE GENERATION CIRCUIT

TECHNICAL FIELD

This disclosure relates to an internal voltage generation circuit.

BACKGROUND

Semiconductor memories generally employ internal voltages for conducting their internal operations, based on power voltages (VDD) and ground voltages (VSS) supplied thereto from external systems. There are various types of voltages necessary for internal operations of the semiconductor memories, such as core voltage (Vcore) supplied into a memory core region, high voltage or pumping voltage (VPP) used in driving or over-driving word lines, back-bias voltage provided for a bulk region for NMOS transistors of the core region, and peripheral voltage (VPERI; hereinafter referred to as "peri-voltage") supplied into a peripheral region where control circuits of the semiconductor memories are disposed.

Meanwhile, semiconductor memories are normally configured to reduce a rate of power dissipation by generating and utilizing internal voltages that are lowered in standby modes, in which commands are waiting to be conducted, than in active modes in which reading and writing operations are carried out. For example, the peri-voltage is designed to be at a target level of 1.8V in the active mode, and to be at 1.2V in the standby mode so as to reduce power consumption.

Figure 1:
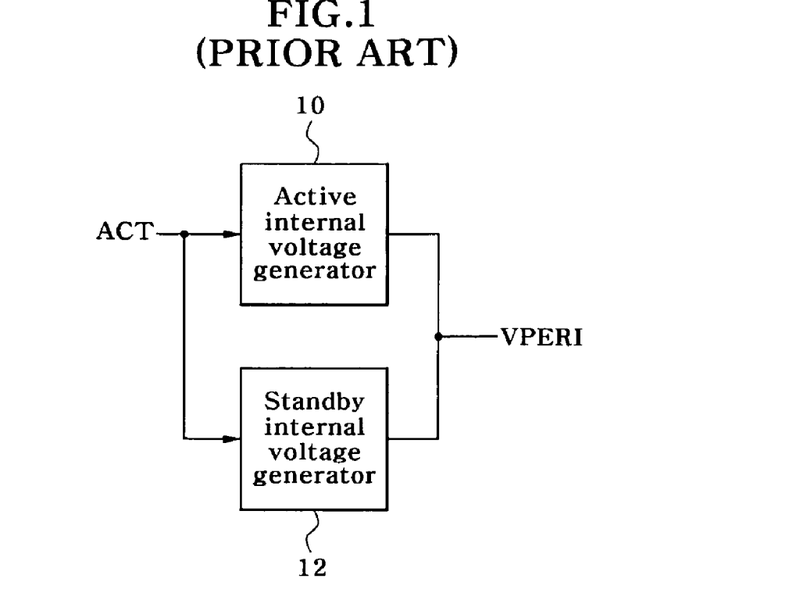
FIG. 1 is a block diagram of a conventional peri-voltage generation circuit.

FIG. 1 is a block diagram of a conventional peri-voltage generation circuit.

As shown in FIG. 1, the general peri-voltage generation circuit is formed of an active internal voltage generator 10 supplying 1.8V as a target level of the peri-voltage VPERI for the active mode, and a standby internal voltage generator 12 supplying 1.2V as a target level of the peri-voltage VPERI for the standby mode. For the purpose of providing the peri-voltage to the target levels, the active and standby internal voltage generators, 10 and 12, are formed of comparators (not shown) each receiving reference voltages of predetermined levels and driving the peri-voltage to the target levels.

The conventional peri-voltage generation circuit with such a configuration operates as follows.

First, in the standby mode, the standby internal voltage generator 12 generates the peri-voltage VPERI to the target level 1.2V in response to an active signal ACT that is disabled. Then, the active signal ACT enabled by an active command stops driving the standby internal voltage generator 12, and begins driving the active internal voltage generator 10 to raise the peri-voltage VPERI up to 1.8V, which is the target level of the active mode, from 1.2V of the standby mode.

However, as the peri-voltage VPERI is driven by the comparator (not shown) of the active internal voltage generator 10 while turning an operation mode from the standby mode to the active mode, it takes much time to raise the peri-voltage VPERI up to the active mode target level 1.8V from 1.2V. Further, while the peri-voltage VPERI is driven to the target level, leakage current could flow through the standby internal voltage generator 12 that has been shut off in operation, causing power dissipation.

SUMMARY

In an embodiment of this disclosure, an internal voltage generation circuit includes an initial driver configured to sense an internal voltage for a predetermined period of time from the beginning of an active mode and to drive a driving signal, which is used for driving the internal voltage to a level of an external voltage, to a first level, an initial driving terminator configured to drive the driving signal to a second level if the internal voltage is higher than a target level and a comparison driver configured to drive the driving signal so as to maintain the internal voltage at a target level.

In another embodiment of this disclosure, an internal voltage generation circuit includes a first internal voltage generator configured to generate an internal voltage in a standby mode, and a second internal voltage generator configured to drive the internal voltage by a driving signal in an active mode, in which the driving signal is driven to a first level for a predetermined period of time after entry into an active mode, to set the internal voltage to a target level, and to maintain the internal voltage at the target level.

BRIEF DESCRIPTION OF THE DRAWINGS

The above and other aspects, features and advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intended to limit the scope of the invention.

Figure 2:
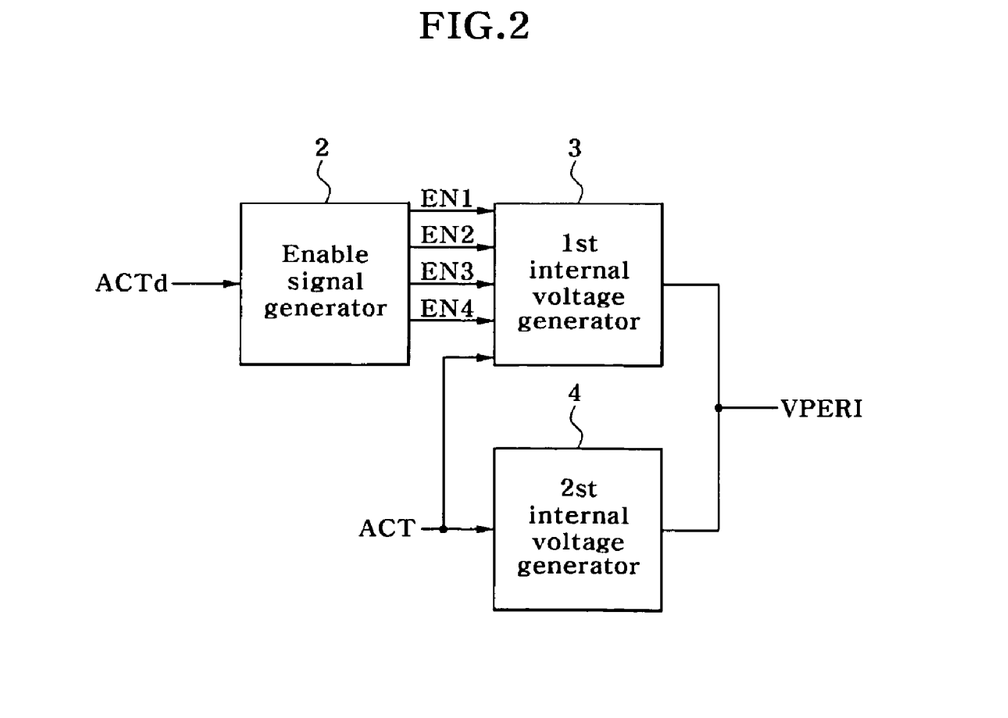
FIG. 2 is a block diagram illustrating a configuration of a peri-voltage generation circuit according to an embodiment of this disclosure.

FIG. 2 is a block diagram illustrating a configuration of a peri-voltage generation circuit according to an embodiment of the present invention.

Figure 3:
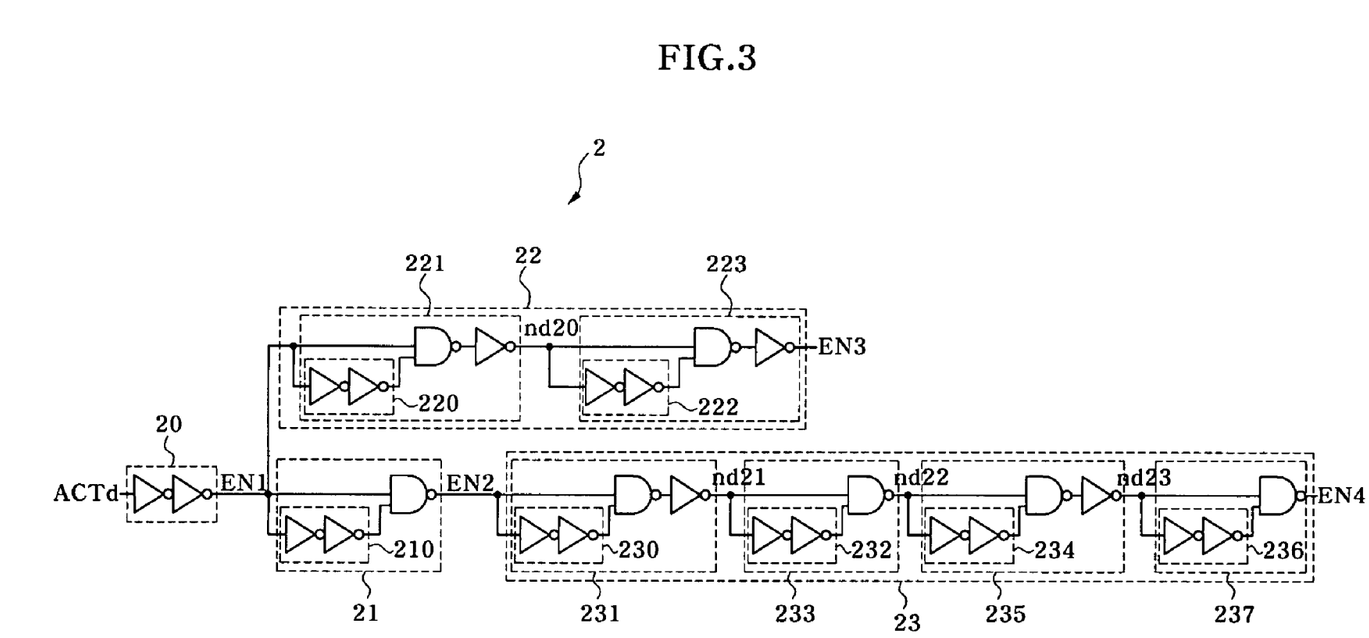
FIG. 3 is a circuit diagram of an enable signal generator included in the peri-voltage generation circuit shown in FIG. 2.

Referring to FIG. 2, the peri-voltage generation circuit according to this embodiment is comprised of an enable signal generator 2, a first internal voltage generator 3, and a second internal voltage generator 4. The enable signal generator 2, as illustrated in FIG. 3, includes a first enable signal generator 20, a second enable signal generator 21, a third enable signal generator 22, and a fourth enable signal generator 23.

The first enable signal generator 20 is composed of a plurality of inverters to delay a delayed active signal ACTd for a predetermined period of time and generate a first enable signal EN1. The delayed active signal ACTd results from delaying an active signal ACT, which is enabled at a high level when an active mode begins, for a predetermined delay time.

The second enable signal generator 21 includes a first delay unit 210 and generates a second enable signal EN2 that is activated at a low level after a delay period of the first delay unit 210 since the first enable signal EN1 has been activated at a high level.

The third enable signal generator 22 is comprised of a first pulse generator 221 including a second delay unit 220, and a second pulse generator 223 including a third delay unit 222. The first pulse generator 221 outputs a signal, which is enabled at a high level, to a node nd20 after a delay period of the second delay unit 220 since the first enable signal EN1 has been activated at a high level. The second pulse generator 223 operates to generate a third enable signal EN3 after a delay period of the third delay unit 222 since a signal of the node nd20 has gone to a high level.

The fourth enable signal generator 23 is organized of a third pulse generator 231 including a fourth delay unit 230, a fourth pulse generator 233 including a fifth delay unit 232, a fifth pulse generator 235 including a sixth delay unit 234, and a sixth pulse generator 237 including a seventh delay unit 236. The third pulse generator 231 outputs a signal, which is activated at a low level while the second enable signal EN2 is activated at a low level and in addition for a delay period of the fourth delay unit 230 after the second enable signal EN2 transitions to a high level, to a node nd21. The fourth pulse generator 233 outputs a signal, which is enabled at a high level while a signal of the node nd21 is at a low level and in addition for a delay period of the fifth delay unit 232 after the signal of the node nd21 transitions to a high level, to a node nd22. The fifth pulse generator 235 outputs a signal, which is enabled at a high level after a delay period of the sixth delay unit 234 since a signal of the node nd22 has gone to a high level, to a node nd23. The sixth pulse generator 237 outputs a fourth enable signal EN4 that is activated at a low level after a delay period of the seventh delay unit 236 since a signal of the node nd23 has gone to a high level.

Figure 4:
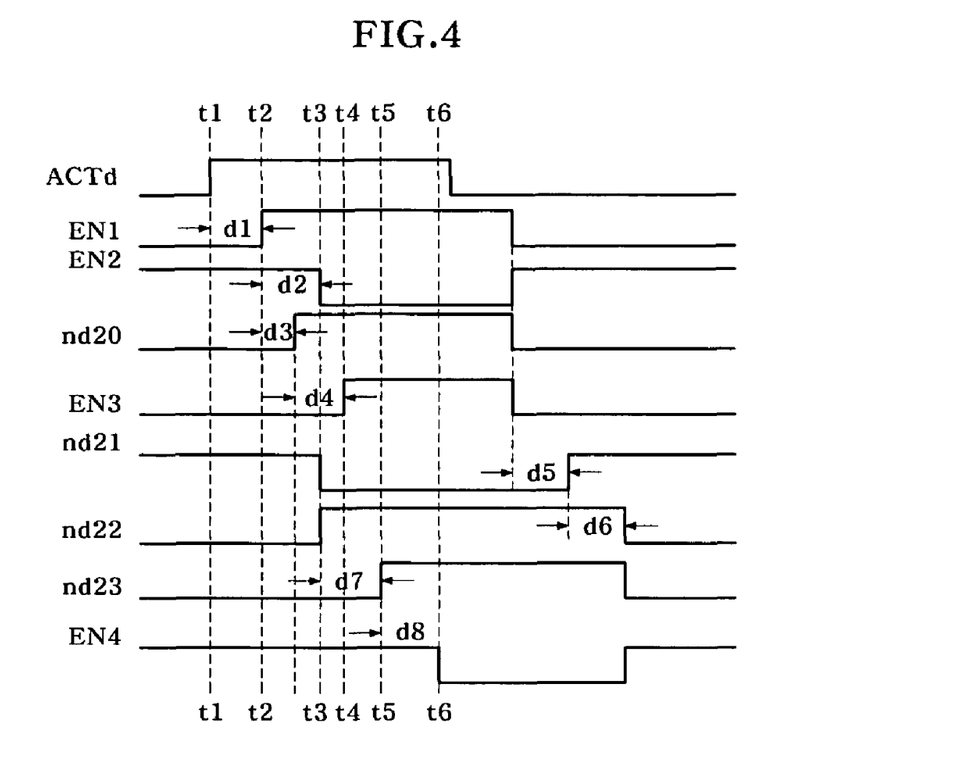
FIG. 4 is a timing diagram of enable signals supplied from the enable signal generator shown in FIG. 3.

FIG. 4 shows a timing diagram of the enable signals EN1-EN4 supplied from the enable signal generator 2. The first enable signal EN1 is activated at a high level at a time t2, after a delay period d1 of the first enable signal generator 20 from a time t1 at which the delayed active signal ACTd is enabled at a high level. The second enable signal EN2 is activated at a low level at a time t3, after a delay period d2 of the first delay unit 210 from the time t2 at which the first enable signal EN1 is activated at a high level. The third enable signal EN3 is activated at a high level at a time t4, after a delay period d3 of the second delay unit 220 and a delay time d4 of the third delay unit 222 from the time t2 at which the first enable signal EN1 is activated at a high level. The fourth enable signal EN4 is activated at a low level at a time t6, after a delay period d7 of the sixth delay unit 234 and a delay period D8 of the seventh delay unit 236 from the time t3 at which the second enable signal EN2 is activated at a low level.

Figure 5:
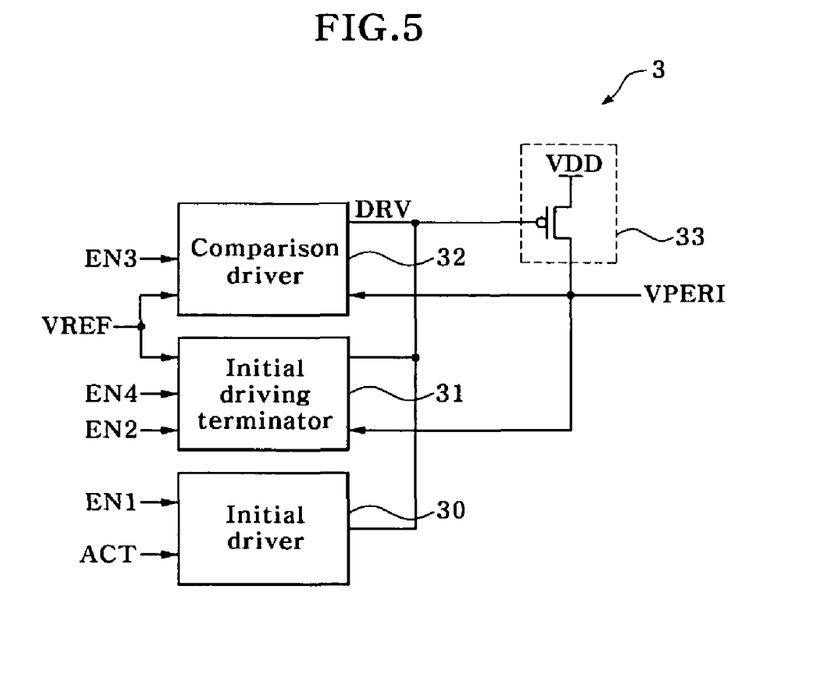
FIG. 5 is a block diagram of a first internal voltage generator included in the peri-voltage generation circuit shown in FIG. 2.

The first internal voltage generator 3, as illustrated in FIG. 5, is comprised of an initial driver 30, an initial driving terminator 31, a comparison driver 32, and an internal voltage driver 33. The internal voltage driver 33 is formed of a PMOS transistor connected between an external voltage VDD and an output node of the peri-voltage VPERI and turned on in response to a driving signal DRV. The detailed configurations of the initial driver 30, the initial driving terminator 31, and the comparison driver 32 will be described as follows.

Figure 6:
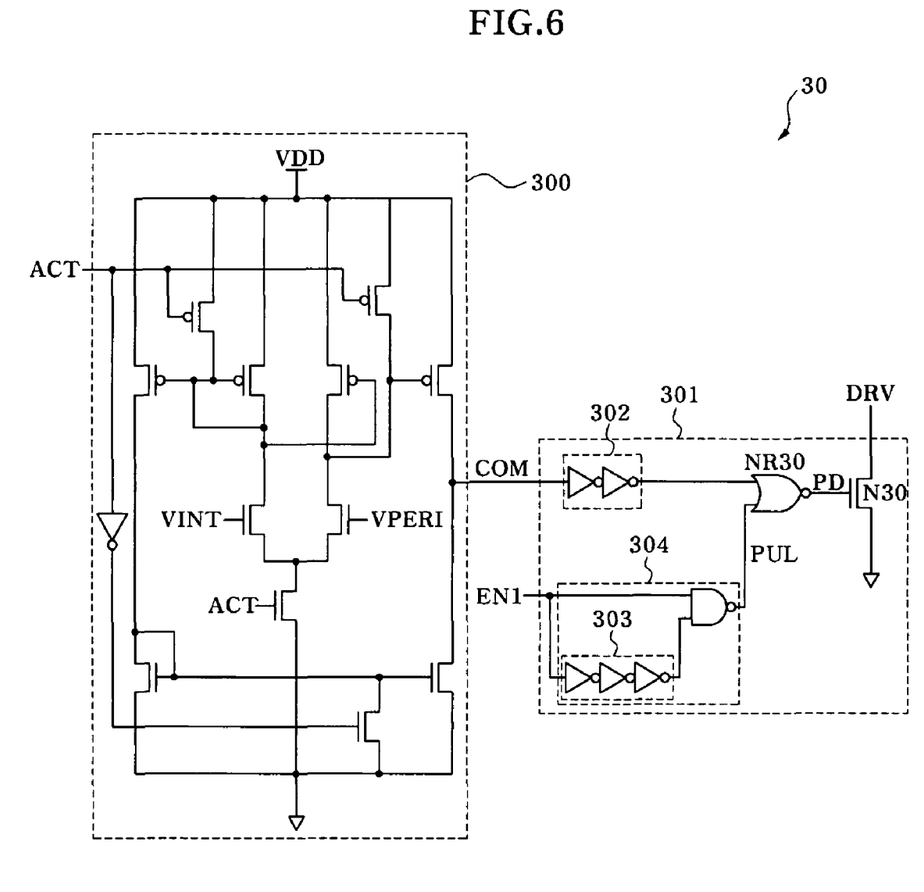
FIG. 6 is a circuit diagram of an initial driver included in the first internal voltage generator shown in FIG. 5.

The initial driver 30, referring to FIG. 6, is comprised of a comparison signal generator 300 and a driving signal driver 301. The comparison signal generator 300 is implemented in a comparator operating in response to an input of the active signal ACT that is enabled at a high level at the beginning of the active mode. The comparison signal generator 300 with such a comparator generates a comparison signal COM of low level when the peri-voltage VPERI is lower than an internal reference voltage VINT. The driving signal driver 301 is formed of a buffer 302, a pulse signal generator 304 including an eighth delay unit 303, a NOR gate NR30, and an NMOS transistor N30. The buffer 302 is composed of a plurality of inverters for buffering and outputting the comparison signal COM. The pulse signal generator 304 operates to generate a pulse signal PUL including a pulse that maintains a low level during a delay period of the eighth delay unit 303 from when the first enable signal EN1 goes to a high level. The NOR gate NR30 operates as a transmission device for inversely buffering and transferring the comparison signal COM as a pull-down signal PD. The NMOS transistor N30 is turned on in response to the pull-down signal PD of high level, pulling down the driving signal DRV to the ground voltage VSS.

Figure 7:
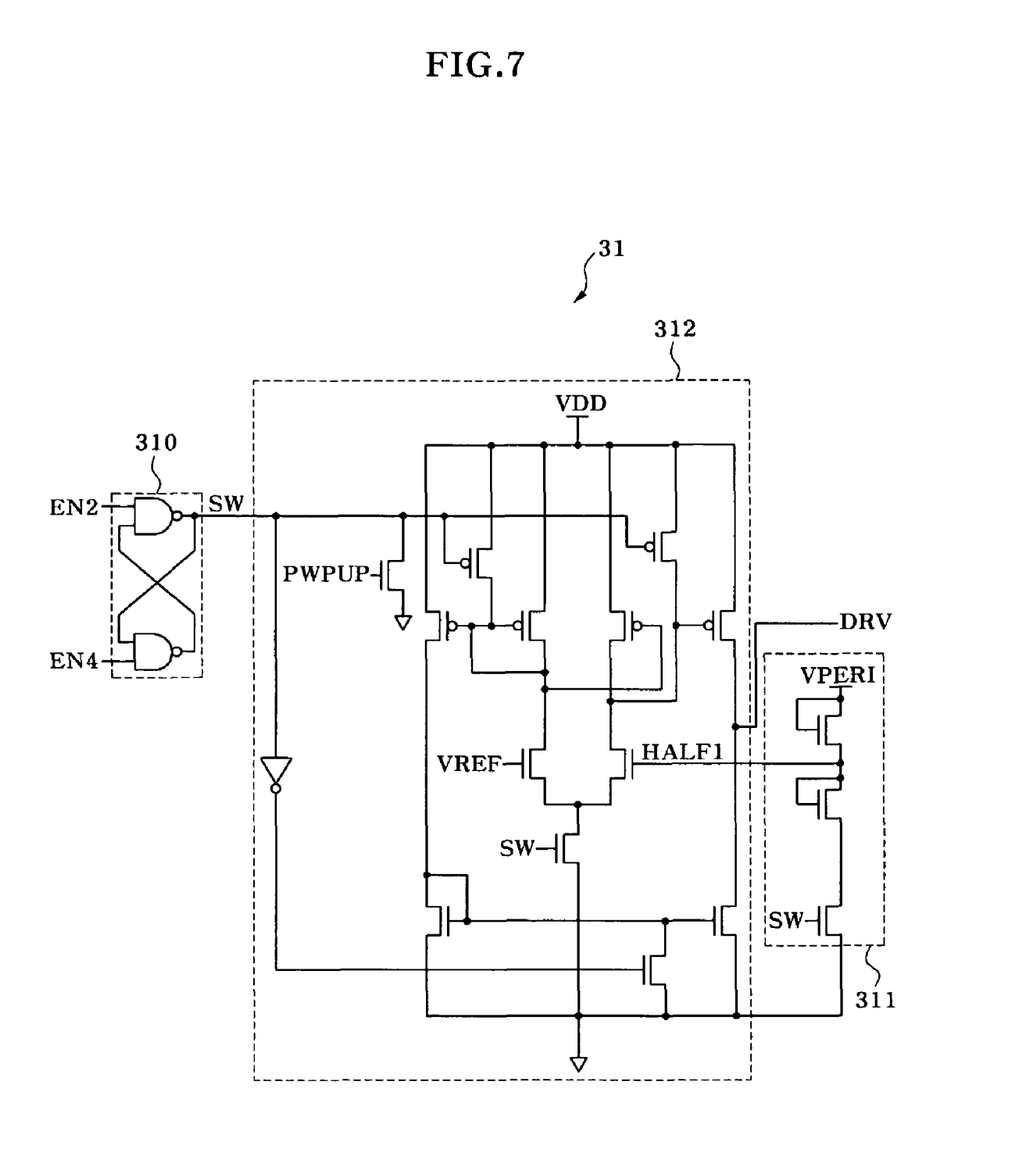
FIG. 7 is a circuit diagram of an initial driving terminator included in the first internal voltage generator shown in FIG. 5.

The initial driving terminator 31, referring to FIG. 7, is comprised of a switch signal generator 310, a first voltage divider 311, and a first comparator 312. The switch signal generator 310 is formed of an SR latch for generating a switch signal SW that is enabled at a high level from when the second enable signal EN2 is activated to a low level until when the fourth enable signal EN4 is activated to a low level. The first voltage divider 311 generates a first divided voltage HALF1 by voltage division. Here, the first divided voltage HALF1 may be set to a half level ($\frac{1}{2}$) of the peri-voltage VPERI. The first comparator 312 is formed of a comparator for raising the driving signal DRV up to the level of the external voltage VDD if the first divided voltage HALF1 is higher than a first reference voltage VREF. The first reference voltage VREF may be set to 0.9V as an example. Thus, the first comparator 312 of the initial driving terminator 31 raises the driving signal DRV up to the level of the external voltage VDD if the peri-voltage VPERI is over 1.8V.

Figure 8:
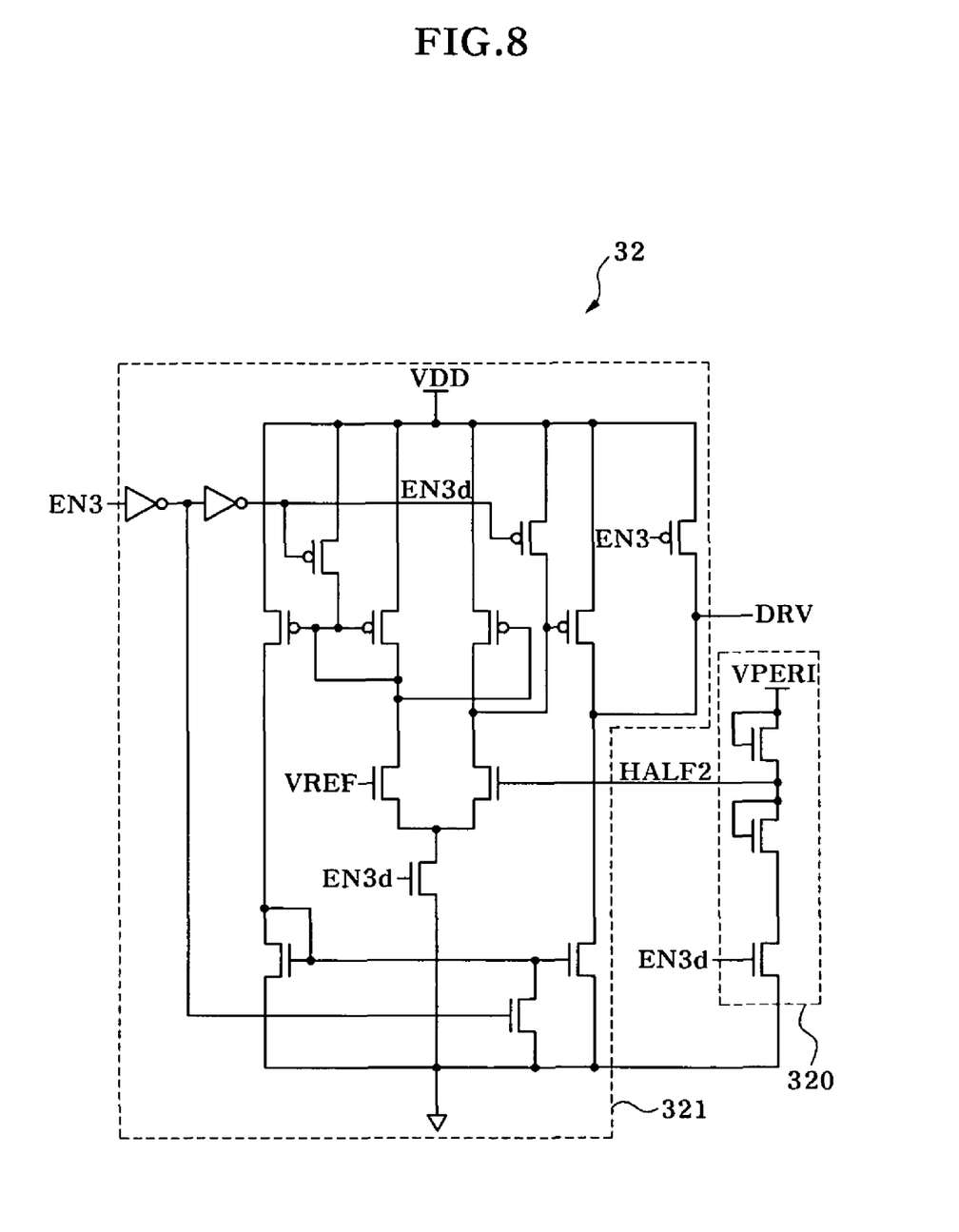
FIG. 8 is a circuit diagram of a driving signal generator included in the first internal voltage generator shown in FIG. 5.

The comparison driver 32, referring to FIG. 8, is comprised of a second voltage divider 320 and a second comparator 321. The second voltage divider 320 divides the peri-voltage VPERI and generates a second divided voltage HALF2. The second divided voltage HALF2 may be set to a half level ($\frac{1}{2}$) of the peri-voltage VPERI. The second comparator 321 is formed of a comparator to pull the driving signal DRV up to the level of the external voltage VDD if the second divided voltage HALF2 is higher than the first reference voltage VREF, or pull the driving signal DRV down to a low level if the second divided voltage HALF2 is lower than the first reference voltage VREF. The comparison driver 32 is enabled to maintain the peri-voltage VPERI at 1.8V as the target level after a predetermined delay period from activation of the initial driver 30 and the initial driving terminator 31.

The NMOS transistors included in the initial driver 30 and the initial driving terminator 31 may be larger in size, providing sufficient current drivability, than those included in the comparison driver 32. This is for the purpose of rapidly raising the peri-voltage VPERI to the target level (that is, 1.8V) by the initial driver 30 in sufficient current drivability at the beginning of the active mode, and quickly stopping driving of the peri-voltage VPERI by the initial driving terminator 31 in sufficient current drivability if the peri-voltage VPERI reaches the target level before the comparison driver 32 operates.

Figure 9:
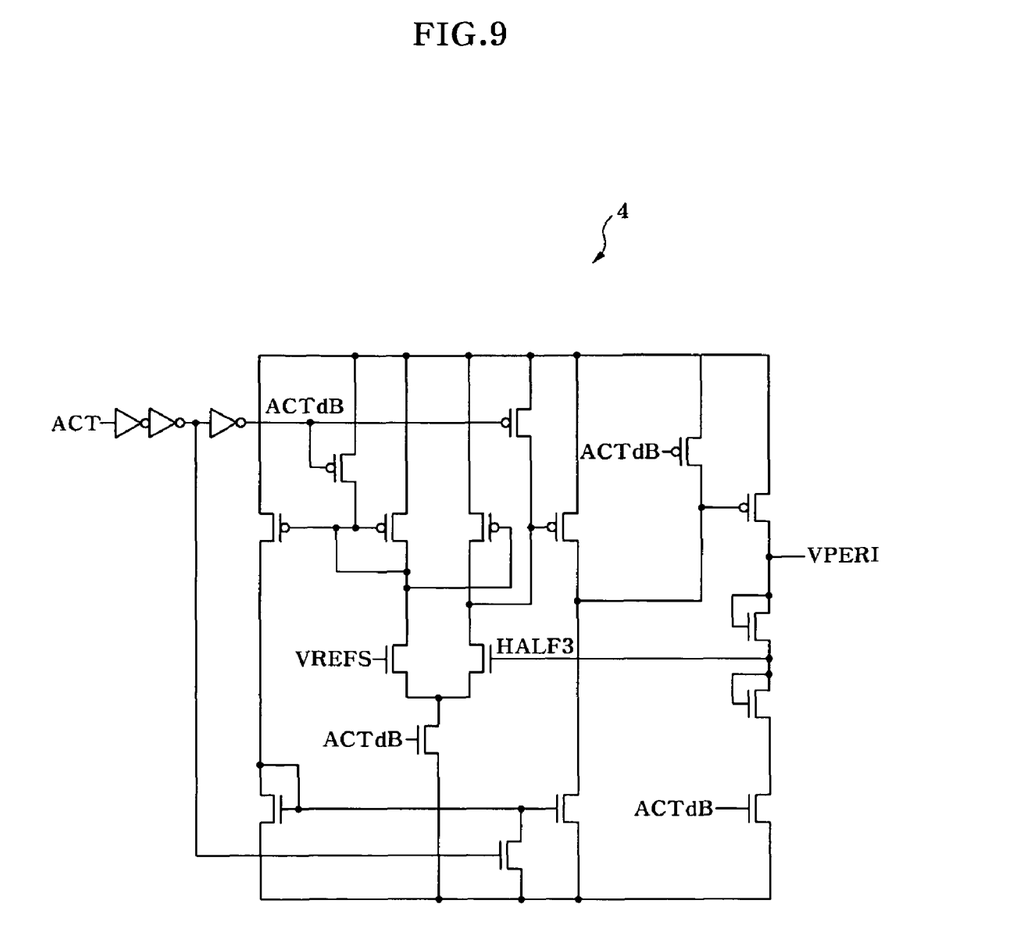
FIG. 9 is a circuit diagram of a second internal voltage generator included in the peri-voltage generation circuit shown in FIG. 2.

The second internal voltage generator 4, referring to FIG. 9, is implemented in a comparator driving the peri-voltage VPERI by comparing a third divided voltage HALF3, which is set from the peri-voltage VPERI through voltage division, to a second reference voltage VREFS. The second internal voltage generator 4 is driven in response to the active signal ACT of low level in the standby mode. Here, the third divided voltage HALF3 may be generated to a half level ($\frac{1}{2}$) of the peri-voltage VPERI and the second reference voltage VREFS may be set to 0.6V. The second internal voltage generator 4 outputs the peri-voltage VPERI at the target level of 1.2V in the standby mode.

The peri-voltage generation circuit having the structure referenced above operates as follows.

In the standby mode, the active signal ACT of low level activates the second internal voltage generator 4 to generate the peri-voltage VPERI at the target level of 1.2V. During this period, the enable signal generator 2 and the first internal voltage generator 3 are disabled.

Once the active mode begins, the active signal ACT goes to a high level. Responding to the active signal ACT of high level, the enable signal generator 2 outputs the first through fourth enable signals EN1-EN4 and the first internal voltage generator 3 drives the peri-voltage VPERI to the target level of 1.8V for the active mode. Now an operation of the first internal voltage generator 3 will be detailed hereinafter.

First, the first enable signal EN1 activated at a high level makes the initial driver 30 pull down the driving signal DRV to the ground voltage VSS. In further detail, the comparison signal generator 300 outputs the comparison signal COM at a low level because the peri-voltage VPERI set to 1.2V in the standby mode is lower than the internal reference voltage VINT. During this period, as the pulse signal generator 304 of the driving signal driver 301 generates the pulse signal PUL including a pulse that maintains a low level during a delay period of the eighth delay unit 303 from when the first enable signal EN1 goes to a high level, the NOR gate NR30 generates the pull-down signal PD at a high level. Then, the NMOS transistor N30 is turned on to pull down the driving signal DRV to the ground voltage VSS. If the driving signal DRV goes down to the ground voltage VSS, the PMOS transistor of the internal voltage driver 33 is turned on to drive the peri-voltage VPERI. Since the initial driver 30 is comprised of NMOS transistors of large size, the peri-voltage VPERI rapidly rises up to the target level of 1.8V in the active mode.

Afterward, the second enable signal EN2 activated at a low level makes the initial driving terminator 31 operate. In further detail, the second enable signal EN2 of low level activates the switch signal SW at a high level to drive the first comparator 312. The first comparator 312 pulls the drive voltage DRV up to the level of the external voltage VDD if the peri-voltage VPERI reaches the target level of 1.8V in the active mode. Thus, the PMOS transistor of the internal voltage driver 33 is turned off to stop driving the peri-voltage VPERI. As the initial driving terminator 31 is formed of large-sized MOS transistors, it is possible to quickly stop driving the peri-voltage VPERI if the peri-voltage VPERI reaches the target level of 1.8V in the active mode.

Next, the third enable signal EN3 activated at a high level makes the comparison driver 32 operate to maintain the peri-voltage VPERI at the target level of 1.8V in the active mode. In further detail, the second voltage divider 320 generates the second divided voltage HALF2 by dividing the peri-voltage VPERI and the second comparator 321 adjusts a voltage level of the driving signal DRV, in response to the third enable signal EN3 of high level, so as to maintain the peri-voltage VPERI at the target level of 1.8V in the active mode. During this period, the fourth enable signal EN4 is activated at a low level to disable the initial driving terminator 31.

The peri-voltage generation circuit according to the present invention offers high current drivability capable of rapidly pulling up the peri-voltage VPERI to the target level of 1.8V by driving the driving signal DRV down to the ground voltage VSS through the initial driver 30 when the operation mode changes from the standby mode to the active mode. Moreover, once the peri-voltage VPERI arrives at the target level of 1.8V in the active mode, the initial driving terminator 31 stops driving the peri-voltage VPERI by raising the driving signal DRV to the level of the external voltage VDD and the comparison driver 32 maintains the peri-voltage VPERI at the target level of 1.8V. As such, the peri-voltage generation circuit according to the present invention is effective in reducing leakage current and power dissipation since the peri-voltage VPERI can rapidly rise up to the target level of 1.8V when the active mode begins from the standby mode.

While the present invention has been described with respect to the specific embodiments, it will be apparent to those skilled in the art that various changes and modifications may be made without departing from the spirit and scope of the invention as defined in the following claims.

The present application claims priority to Korean application number 10-2009-0026045, filed on Mar. 26, 2009, which is incorporated by reference in its entirety.

What is claimed is:

1. An internal voltage generation circuit, comprising:
    a first enable signal generator configured to delay an active signal for a predetermined delay time and to generate a first enable signal;
    a second enable signal generator configured to generate a second enable signal that is activated after a first predetermined period since a time the first enable signal is activated;
    a third enable signal generator configured to generate a third enable signal that is activated after a second predetermined period since a time the second enable signal is activated;
    an initial driver configured to sense an internal voltage to drive a driving signal, which is used for driving the internal voltage to a level of an external voltage, to a first level in response to the first enable signal; and
    a comparison driver configured to drive the driving signal to maintain the internal voltage at a target level in response to the third enable signal.

2. The internal voltage generation circuit of claim 1, wherein if the internal voltage is lower than a predetermined level, the initial driver drives the driving signal to the first level set to a ground voltage.

3. The internal voltage generation circuit of claim 1, wherein the initial driver comprises:
    a comparison signal generator configured to compare the internal voltage with an internal reference voltage, in response to an active signal, and to generate a comparison signal; and
    a driving signal driver configured to receive the comparison signal, in response to the first enable signal, and to drive the driving signal to the first level.

4. The internal voltage generation circuit of claim 3, wherein the driving signal driver comprises:
    a pulse signal generator configured to receive the first enable signal and to generate a pulse signal;
    a transmission device configured to buffer and transfer the comparison signal as a pull-down signal in response to the pulse signal; and
    a drive device configured to drive the driving signal to the first level in response to the pull-down signal.

5. The internal voltage generation circuit of claim 4, wherein a pulse of the pulse signal is generated in a period in which the enable signal is activated.

6. The internal voltage generation circuit of claim 4, wherein the drive device is a MOS transistor connected between the driving signal and a ground signal and turned on in response to the pull-down signal.

7. The internal voltage generation circuit of claim 1, which further comprises: an initial driving terminator configured to drive the driving signal to a second level if the internal voltage is higher than the target level.

8. The internal voltage generation circuit of claim 7, wherein the initial driving terminator comprises:
- a switch signal generator configured to generate a switch signal in response to the second enable signal and fourth enable signal;
- a voltage divider configured to divide the internal voltage and to generate a divided voltage; and
- a comparator configured to compare the divided voltage with a reference voltage and to drive the driving signal to the second level.

9. The internal voltage generation circuit of claim 8, wherein the switch signal is enabled if the second enable signal is activated, and is disabled if the fourth enable signal is activated.

10. The internal voltage generation circuit of claim 9, wherein the fourth enable signal is activated after a third predetermined period since the time the second enable signal is activated.

11. The internal voltage generation circuit of claim 8, wherein if the internal voltage is equal to the reference voltage in level, the comparator drives the driving signal to the second level set to the external voltage.

12. The internal voltage generation circuit of claim 1, wherein the comparison driver comprises:
- a voltage divider configured to divide the internal voltage and to generate a divided voltage; and
- a comparator configured to compare the divided voltage with a reference voltage, in response to the third enable signal, and to drive the driving signal.

13. An internal voltage generation circuit, comprising:
- a first internal voltage generator configured to generate an internal voltage in standby mode; and
- a second internal voltage generator configured to drive the internal voltage by a driving signal in an active mode, in which the driving signal is driven to a first level for a predetermined period of time after entry into an active mode, to set the internal voltage to a target level, and to maintain the internal voltage at the target level,
wherein the second internal voltage generator comprises:
an enable signal generator configured to receive an active signal and to generate first through fourth enable signals;
an initial driver configured to drive the driving signal to the first level in response to the first enable signal;
an initial driving terminator configured to drive the driving signal to a second level in response to the first enable signal; and
a comparison driver configured to drive the driving signal to maintain the internal voltage at the target level in response to the third enable signal.

14. The internal voltage generation circuit of claim 13, wherein the enable signal generator comprises:
- a first enable signal generator configured to delay the active signal for a predetermined delay time and to generate the first enable signal;
- a second enable signal generator configured to generate a second enable signal that is activated after a predetermined period since a time the first enable signal is activated;
- a third enable signal generator configured to generate a third enable signal that is activated after a predetermined period since a time the second enable signal is activated; and
- a fourth enable signal generator configured to generate a fourth enable signal that is activated after a predetermined period since the time the second enable signal is activated.

15. The internal voltage generation circuit of claim 13, wherein the initial driver comprises:
- a comparison signal generator configured to compare the internal voltage with an internal reference voltage, in response to the active signal, and to generate a comparison signal; and
- a driving signal driver configured to receive the comparison signal, in response to the first enable signal, and to drive the driving signal to the first level.

16. The internal voltage generation circuit of claim 15, wherein the driving signal driver comprises:
- a pulse signal generator configured to receive the first enable signal and to generate a pulse signal;
- a transmission device configured to buffer and to transfer the comparison signal as a pull-down signal in response to the pulse signal; and
- a drive device configured to drive the driving signal to the first level in response to the pull-down signal.

17. The internal voltage generation circuit of claim 16, wherein a pulse of the pulse signal is generated in a period of time in which the first enable signal is activated.

18. The internal voltage generation circuit of claim 13, wherein the initial driving terminator comprises:
- a switch signal generator configured to receive the second and fourth enable signals and to generate a switch signal;
- a voltage divider configured to divide the internal voltage and to generate a divided voltage; and
- a comparator configured to compare the divided voltage with a reference voltage and to drive the driving signal to the second level.

19. The internal voltage generation circuit of claim 18, wherein the switch signal is enabled if the second enable signal is activated, and disabled if the fourth enable signal is activated.

20. The internal voltage generation circuit of claim 18, wherein if the internal voltage is equal to the reference voltage in level, the comparator drives the driving signal to the second level set to the external voltage.

21. The internal voltage generation circuit of claim 13, wherein the comparison driver comprises:
- a voltage divider configured to divide the internal voltage and to generate a divided voltage; and
- a comparator configured to compare the divided voltage with a reference voltage, in response to the third enable signal, and to drive the driving signal.

22. The internal voltage generation circuit of claim 21, wherein the third enable signal is activated after a predetermined period since a time the initial driver and the initial driving terminator begun to operate.

* * * * *